United States Patent [19]

Nishizawa et al.

[11] 4,216,038
[45] Aug. 5, 1980

[54] SEMICONDUCTOR DEVICE AND MANUFACTURING PROCESS THEREOF

[75] Inventors: Jun-ichi Nishizawa, Sendai; Yasunori Mochida, Hamamatsu; Terumoto Nonaka, Hamamatsu; Tadahiko Hotta, Hamamatsu; Shin Yamashita, Hamamatsu, all of Japan

[73] Assignee: Nippon Gakki Seizo Kabushiki Kaisha, Hamamatsu, Japan

[21] Appl. No.: 913,006

[22] Filed: Jun. 5, 1978

[30] Foreign Application Priority Data

Jun. 11, 1977 [JP] Japan .................. 52-69325

[51] Int. Cl.² ........................... H01L 21/22
[52] U.S. Cl. ................... 148/187; 148/188; 357/43
[58] Field of Search ............... 148/187, 188; 357/43

[56] References Cited

U.S. PATENT DOCUMENTS

| | | | |
|---|---|---|---|
| 3,821,776 | 6/1974 | Hayashi et al. | 357/42 X |
| 3,846,821 | 11/1974 | Nagata et al. | 148/187 X |
| 3,909,320 | 9/1975 | Cauge et al. | 148/187 |
| 3,923,553 | 12/1975 | Hayashi et al. | 148/187 X |
| 3,988,761 | 10/1976 | Kanazawa | 357/46 X |
| 4,013,484 | 3/1977 | Boleky et al. | 148/187 X |
| 4,076,557 | 2/1978 | Huang et al. | 148/1.5 |

OTHER PUBLICATIONS

Electronics (International Edition), Aug. 19, 1976, pp. 4E and 6E.

*Primary Examiner*—G. Ozaki
*Attorney, Agent, or Firm*—Cushman, Darby & Cushman

[57] ABSTRACT

In a semiconductor device of the type arranged so that the minority carriers are injected into a lightly-doped n type semiconductor layer from a heavily-doped p type semiconductor layer provided in the n type layer, that portion of the p type layer excluding a certain portion is separated from the n type layer by a separator layer to cause the p type layer to contact the n type layer only at the certain portion, whereby the carrier injection is restricted to occur within a limited region of the n type layer contacting the certain portion of the p type layer. The separator and the p type layer are formed, by relying on a self-alignment technique using a double-mask layer, as diffused regions partially overlapping each other with a good relative alignment in the n type layer.

11 Claims, 7 Drawing Figures

SEMICONDUCTOR DEVICE AND MANUFACTURING PROCESS THEREOF

BACKGROUND OF THE INVENTION (a) Field of the Invention:

The present invention relates to a semiconductor device and a process for manufacturing same, and more particularly it pertains to a modified integrated injection logic (IIL) device or a modified merged transistor logic (MTL) device including lateral bipolar transistors and vertical field effect transistors (including static induction transistor), and also concerns an improved process for manufacturing same.

(b) Description of the Prior Art:

A modified integrated injection logic (IIL) device employing a bipolar transistor of lateral structure as its injector or load transistor and a field effect transistor of vertical type including static induction transistor (SIT) as its driver or inverter transistor has been proposed. In general, this type of IIL device (hereinafter to be referred to as SITL device which is an abbreviation of a Static Induction Transistor Logic device) is superior, in such aspects as operating speed, power dissipation, simplicity of manufacturing process and so forth, to conventional IIL devices employing bipolar transistors as its driver and injector transistors, and this SITL has such a basic structure as shown in FIG. 1.

In FIG. 1, a known IIL device includes a semiconductor wafer 10 consisting of a heavily doped n+ type semiconductor substrate 12 of a row resistivity and a lightly doped n− type semiconductor layer 14 of a high resistivity. In the layer 14 are formed a heavily doped p+ type semiconductor layer 16 of a low resistivity, a pair of heavily doped p+ type semiconductor layers 18 and 18' of a low resistivity, and a heavily-doped n+ type semiconductor layer 24 of a low resistivity. The respective layers 14, 16 and 18 jointly constitute a bipolar transistor of lateral structure to serve as an injector transistor of the device. More particularly, the p+ type layer 16 serves as the emitter of the injector transistor; the p+ type layer 18 to serve as the collector; and a portion 20 of the n− type layer 14 which is sandwiched between the p+ type layers 16 and 18 to serve as the base of the injector transistor. On the other hand, an improved field effect transistor of vertical type (also referred to SIT which is an abbreviation of a Static Induction Transistor) to function as a driver or inverter transistor of the device is formed by the n+ type layer 12 to serve as the source, the n+ type layer 24 to serve as the drain, the p+ type layers 18 and 18' to serve as the gates, and that n− type portion 22 of the n− type layer 14 which is sandwiched between the respective gates 18 and 18', to serve as the current rent channel. As described, the collector of the injector bipolar transistor and the gates of the driver field effect transistor are merged in the single common layer 18, thus effectively performing carrier injection from the injector transistor into the driver transistor gates. The respective gates 18 and 18' are usually formed to be continuous or wired together to be held at a same potential.

In case no bias voltage is externally applied to the gates 18 and 18', the current channel 22 of the driver transistor is almost entirely depleted by only the diffusion potential of the gates and accordingly held substantially non-conductive. That is, the driver transistor is an SIT of the normally-off type, i.e. of an enhancement mode. Therefore, in order to render the current channel conductive, it is necessary to forwardly bias the gates slightly and thereby to inject carriers from the gates into the current channel through the gate-channel p-n junctions formed along the boundaries between the gates and the current channel. With the structure illustrated in FIG. 1, however, a larger number of carriers which are actually useless for the channel-conduction control are injected from the gates into the high-resistivity region of the layer 14 other than that really serving as the current channel 22, and this, in turn, contributes to degradation of carrier injection efficiency and also brings about a carrier storage effect which should slow down the switching speed of the driver transistor. This problem also holds true to the injector bipolar transistor.

Recently, an SITL device which has been improved further than that mentioned above has been proposed in U.S. Patent Application No. 854494 filed on Nov. 23, 1977 by Terumoto NONAKA, one of the present inventors. In this improved SITL device, the gate region of the driver SIT is formed to directly contact at least one of the source and drain regions and/or the emitter region of the injector bipolar transistor is formed to establish a direct contact with the source region, in order to eliminate as much as possible the useless high-resistivity region which would be responsible for the aforementioned undesirable injection of carriers and carrier storage effect.

SUMMARY OF THE INVENTION

It is a general object of the present invention to provide a semiconductor device which has a novel structure for properly directing the carrier injection so as to reduce the carrier storage effect and to enhance the carrier injection efficiency in the device.

Another object of the present invention is to provide an improved SITL device which is capable of operating at an increased speed and a small power dissipation.

Still another object of the present invention is to provide an SITL device of the type described, of which the driving power efficiency is increased.

Yet another object of the present invention is to provide a transistor suitable for use in an SITL device of the type described, which is free from the carrier storage effect and has a large current gain.

A further object of the present invention is to provide a process of manufacture which can be effectively applied to a semiconductor device of the type described above.

A still further object of the present invention is to provide a simplified process for manufacturing a semiconductor device of the type described at a high yield.

According to the present invention, there is provided a semiconductor device comprising; a first semiconductor layer having a first conductivity type and a low impurity concentration; a second semiconductor layer having a second conductivity type opposite to said first conductivity type and a high impurity concentration, the second semiconductor layer being provided in said first semiconductor layer to surround, at a certain portion thereof, a particular region of said first semiconductor layer; and a separator layer inserted between said first semiconductor layer and that portion of said second semiconductor layer other than said certain portion thereof to restrict the injection of carriers, through the separator layer, from said second semiconductor layer into said first semiconductor layer. The separator layer may be formed by either a semiconductor material having the second conductivity type and a relatively low impurity concentration or a semiconductor material having the first conductivity type and a high impurity concentration as the case may require. If the separator layer is formed by the semiconductor material having the second conductivity type and a low impurity concentration, such an additional advantage is obtained that junction capacitance between the first and second semiconductor layer is reduced at the portion where the separator layer intervenes.

According to a manufacturing process of the present invention, the above-described semiconductor device of the present invention is formed by the steps of: (a) forming, on one surface of said first semiconductor layer, a double-mask layer formed with two different laminated films with a first aperture formed therein in such dimension as corresponding to that of said separator layer; (b) next, selectively diffusing impurity elements of either the first or the second conductivity type into said first semiconductor layer through said first aperture of the double-mask layer to form a third semiconductor layer in said first semiconductor layer; (c) thereafter, selectively etching, through said first aperture of the outer one film of said double-mask layer, the edge portion of said first aperture in the inner one film of the double-mask layer to widen this first aperture, thereby forming a second aperture in the inner one film in such dimension as corresponding to that of said second semiconductor layer; and (d) then diffusing impurity elements of the second conductivity type through said second aperture of said double-mask layer into said first semiconductor layer to form said second semiconductor layer in such a manner that the second semiconductor layer which has thus been formed overlaps that portion of said third semiconductor layer located at site other than a portion serving as said separator layer.

These and other objects as well as the features and the advantages of the present invention will become apparent by reading the following detailed description of the preferred embodiments when taken in conjunction with the accompanying drawings.

DETAILED DESCRIPTION OF THE PREFERRED EMBODIMENTS

Figure 1:
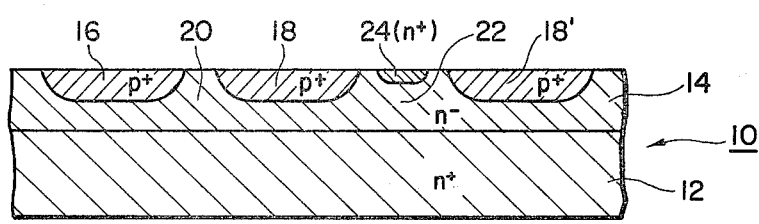
FIG. 1 is a diagrammatic vertical section of an SITL device of the prior art.
Figure 2:
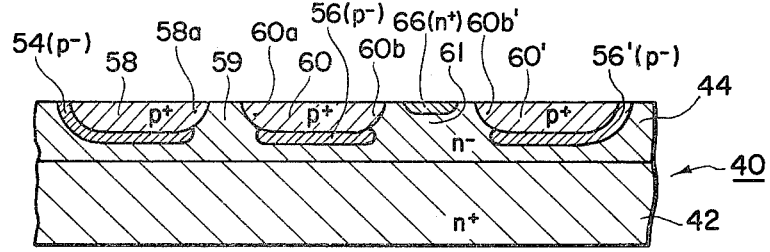
FIG. 2 is a diagrammatic vertical section of an example of an SITL device according to the present invention.

In FIG. 2 is shown, in diagrammatic vertical section, an example of an SITL device according to the present invention, which includes a semiconductor wafer 40 comprising an n+ type semiconductor substrate 42 having a relatively high impurity concentration, e.g. $10^{24}$–$10^{26}$ atoms/m$^3$ and a lightly-doped n$^-$ type semiconductor layer 44 having a relatively low impurity concentration, e.g. $10^{18}$–$10^{21}$ atoms/m$^3$. In the n$^-$ type semiconductor layer 44 is provided heavily-doped p+ type semiconductor layers 58, 60 and 60' having a relatively high impurity concentration, e.g. $10^{23}$–$10^{26}$ atoms/m$^3$. A heavily-doped n+ type semiconductor layer 66 having a relatively high impurity concentration, e.g. $10^{24}$–$10^{26}$ atoms/m$^3$ is provided in the upper portion of that region of the layer 44 sandwiched between the interface portions 60b and 60b' of the layers 60 and 60'.

An SIT of the so-called enhancement mode, i.e. a driver or inverter transistor of this SITL device, is composed of the n+ type layer 42 to serve as the source, the n+ type layer 66 to serve as the drain, the respective p+ type layers 60 and 60' to serve as the gates, and the n$^-$ type region 61 the n$^-$ type layer 44 to serve as the current channel. On the other hand, a lateral bipolar transistor, i.e. an injector transistor of the SITL device, is formed by the p+ type layer 58 to serve as the emitter, the p+ type layer 60 to serve as the collector, and that n$^-$ type region 59 serving as the base of the n$^-$ type layer 44 which is sandwiched between a p+ type portion 58a of the p+ type layer 58 and a p+ type portion 60a of the p+ type layer 60 facing said portion 58a.

Furthermore, according to the present invention, there is provided a p$^-$ type separator layer 54 between the n$^-$ type layer 44 and that portion of the p+ type layer 58 excluding the portion 58a to serve as the real emitter of the injector transistor. Similarly, a pair of p$^-$ type separator layers 56 and 56' are inserted between the n$^-$ type layer 44 and those portions of the layers 60 and 60' excluding the p+ type portions 60b and 60b' to serve as the real gates of the driver or inverter transistor. These p$^-$ type separator layers are intended to restrict the undesirable carrier injection therethrough from the p+ type layers 58, 60 and 60' into the n$^-$ type layer 44, and these p$^-$ type separator layers may be formed by either a p$^-$ semiconductor material having a relatively low impurity concentration, e.g. $10^{18}$–$10^{21}$ atoms/m$^3$ or an n+ type semiconductor material having a relatively high impurity concentration, e.g. $10^{22}$–$10^{26}$ atoms/m$^3$, as the case may be.

The following describes the operation of the embodiment illustrated above.

In case there is no injection of carriers from the injector bipolar transistor into the p+ type gates 60 and 60' of the driver field effect transistor or static induction transistor, and in case the gates are held at a low potential, substantially the entire range of the current channel 61 is filled with the depletion layers spreading from the gate-channel p-n junctions formed along the boundaries between the current channel 61 and the adjacent portions 60b and 60b' of the gates 60 and 60'. Accordingly, the driver transistor is held in its non-conducting state. It should be noted that the respective gates 60 and 60' are formed to be continuous to each other or wired together so that they may be held at the same potential.

In case the emitter 58 of the injector bipolar transistor is pulled up to a positive potential, the carriers, i.e. holes, are injected from the emitter into the base 59. The carriers injected into the base are transported into the collector, thus raising the potential of the gates 60 and 60' of the driver field effect transistor in some cases up to the built-in barrier potential of the gates. As a result, the gate-channel p-n junction is forward-biased so that a sufficient amount of carriers are injected from the gates into the current channel 61 to thereby render the current channel conductive. In this state, however, there hardly occurs an undesirable injection of carriers from the layers 58, 60 and 60' into the remaining portion of the layer 44 except the current channel region 61 and the base region 59, because of the provision of the respective separator layer 54, 56 and 56'.

It can easily be understood, therefore, that the SITL device according to the present invention is hardly subjected to the so-called carrier storage effect therein, thus being capable of making a much quicker switching action, and also that both the injector and the driver transistors of the device are able to provide a higher current gain, i.e. carrier injection efficiency for operation.

According to the present invention, there is also proposed a process for manufacturing a semiconductor device which is effectively applicable to the manufacture of such a semiconductor device having such a separator layer as described above. In accordance with this process of the present invention, the SITL device having the separator layer preferably may be formed by following the steps as shown in FIG. 3A through FIG. 3E.

(a) Preliminary step (see FIG. 3A):

A semiconductor wafer 40 is prepared by forming an $n^-$ type semiconductor layer 44 on top of an $n^+$ type semiconductor substrate 42 by relying on, for example, the known epitaxial growth technique.

(b) First step (see FIG. 3A):

On the upper surface of the semiconductor wafer 40, there is deposited a double-mask layer 43 consisting of a first film 46, e.g. $SiO_2$ film, and a second film 48, e.g. $Si_3N_4$ film, superposed on this $SiO_2$ film 46. The $SiO_2$ film 46 may be formed by oxidizing the upper surface of the wafer 40, and the $Si_3N_4$ may be deposited by, for example, the known chemical vapor-deposition technique. By relying on, for example, the photo-etching method, there are formed, on the double-mask layer 43, apertures 50, 52 and 52' is such a pattern as will correspond to those of the separator layers 54, 56 and 56' which will be seen in FIG. 3D. Then, an impurity element of a required type, e.g. phosphorus element, is selectively diffused through the apertures 50, 52 and 52' of the double-mask layer 43 into the layer 44 to form doped regions 54A, 56A and 56A' having a required impurity concentration and a required conductivity type, e.g. $n^+$ type. These doped $n^+$ type regions 54A, 56A and 56A' eventually will be used partially as separator layers 54, 56 and 56' which will be seen in FIG. 3D.

Figure 3A:
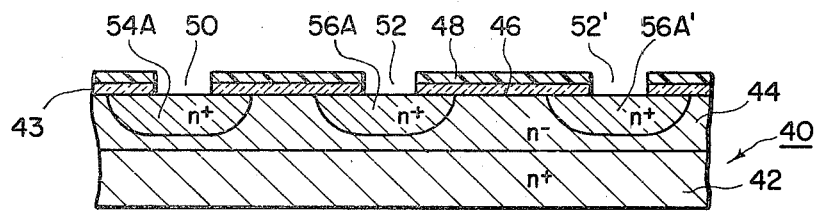
FIGS. 3A to 3E are diagrammatic illustrations showing an example of the process of the present invention to manufacture the SITL device of FIG. 2.
Figure 3B:
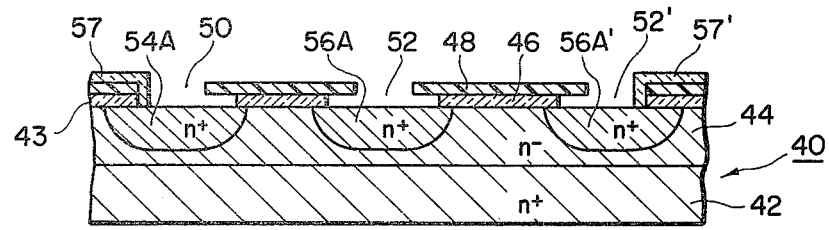
Figure 3C:
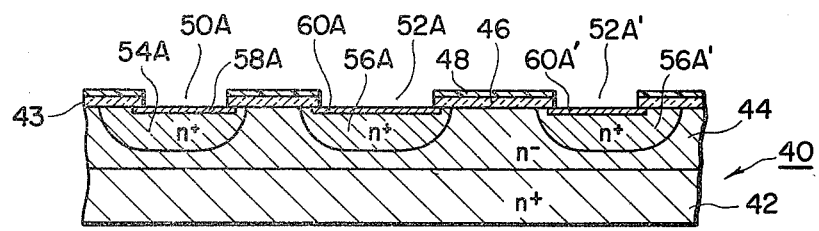
Figure 3D:
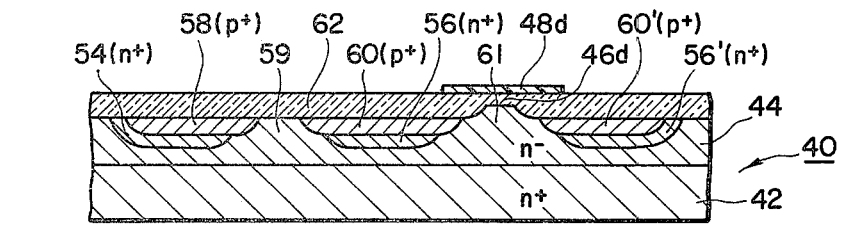

(c) Second step (see FIG. 3B):

After covering with photo-resist films 57 and 57' such portions of the double-mask layer 43 as correspond to portions in an upper surface of the layer 44 where the $n^+$ type regions 54A and 56A' are left to serve as parts of the separator layers 54 and 56, the $SiO_2$ film 46 is subjected to side etching through the apertures 50, 52 and 52' so that these apertures 50, 52 and 52' provided on the $SiO_2$ film 46 are widened into such dimensions as will match those of a $p^+$ type emitter 58 and $p^+$ type gates 60 and 60' which are shown in FIG. 3D. The $SiO_2$ film 46 is etched only at the exposed side portions thereof due to the existance of the $Si_3N_4$ film and by using a suitable etchant effective exclusively on $SiO_2$, so that preciseness in dimensions of the widened apertures 50, 52 and 52' are remarkably improved.

(d) Third step (see FIG. 3C):

After the photo-resist films 57 and 57' are removed by a suitable remover, the edge portions of the $Si_3N_4$ films 48 provided above the aperture edges of the $SiO_2$ films 46 are etched away by applying a solution of hot phosphoric acid to make widened apertures 50A, 52A and 52A' in the mask 43. Thereafter, an impurity element of p type, e.g. boron element, is deposited through the mask apertures 50A, 52A and 52A' onto the exposed surfaces of the layer 44 to form $p^+$ type deposited layers 58A, 60A and 60A'.

Figure 3E:
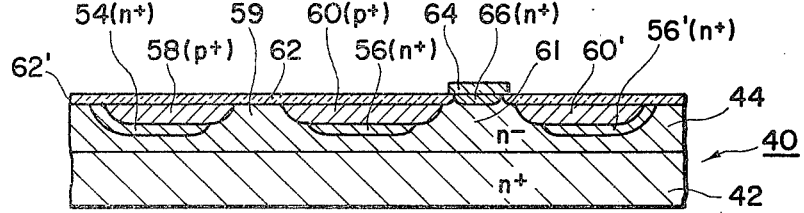

(e) Fourth step (see FIG. 3D):

The masking layer 43, leaving those portions 46d and 48d thereof positioned over a location where there is formed an $n^+$ type drain 66 as will be seen in FIG. 3E, is removed by relying on, for example, the known etching method. Then, the device which is being made is heated in an oxidizing atmosphere so that the impurity elements contained in the deposited $p^+$ type layers 58A, 60A and 60A' are caused to be diffused for a depth less than that of the doped regions 54A, 56A and 56A'. As a result, there are obtained a heavily-doped emitter 58 which is $p^+$ type in this example and heavily-doped $p^+$ type gates 60 and 60'. Simultaneously, separator layers 54, 56 and 56' for the restriction of undesirable carrier injection are formed to be located between the layer 44 and each of the emitter and the gate regions. Furthermore, the $n^-$ type base region 59 and the $n^-$ type current channel region 61 are defined between the $p^+$ type emitter 58 and the $p^+$ type gate 60 and between the gate 60 and the gate 60', respectively. In this step, $SiO_2$ film 62 is formed on the exposed upper surface of the wafer 40.

(f) Final step (see FIG. 3E):

After removing the $Si_3N_4$ film 48d, the etching treatment is applied to the $SiO_2$ film to remove this film by at least a half of the thickness thereof, so that the upper end portion of the $n^-$ type current channel region 61 is exposed through an $SiO_2$ film 62' of the reduced thickness. Then, on this exposed portion is deposited a layer 64 of semiconductor polycrystal such as polycrystalline silicon, which will be used as a drain electrode. Thereafter, an n type impurity element, e.g. phosphorus element, is heavily doped into the layer 64, so that this impurity element diffuses into the upper portion of the $n^-$ type current channel region 61 to form a heavily-doped $n^+$ type drain 66. It should be noted, however, that a previously heavily-doped polysilicon layer can be deposited directly on the portion 66. Or, alternatively, the drain 66 may be formed directly by diffusing an n type impurity element, by using the $SiO_2$ film 62' as the diffusion mask. Thus, an SITL device as shown in FIG. 3E is completed.

As will be readily understood easily from the above explanation, it is possible to manufacture an improved SITL device with a good yield in accordance with the manufacturing process of the present invention wherein an effective self-alignment technique using a common double-mask layer is utilized for the formation of both the emitter and the gate regions and also the carrier-injection restricting separator layers to readily ensure a precise alignment of the intermediate layers relative to the emitter and the gate (collector) regions, or in other words, to unfailingly prevent the occurrence of misalignment between these regions and layers.

Additionally, speaking, the previously described embodiment of the present invention can be modified by reversing the conductivity types of all of the semiconductor layers and regions.

What is claimed is:

1. A process for manufacturing a field effect transistor in a semiconductor wafer including a semiconductor region having a first conductivity type and a low impurity concentration, which process comprises the steps of:

(a) forming, on one surface of said semiconductor region, a double-mask layer from a first film and a second film superposed on said first film, and having an aperture formed through said double-mask layer;

(b) diffusing an impurity element of a predetermined first conductivity type into said semiconductor region through said aperture to form a diffused region having said first conductivity type and a predetermined impurity concentration;

(c) selectively etching said first film through said aperture and widening at least partially the aperture on said first film, thereby obtaining a new aperture on said first film;

(d) diffusing an impurity element of a second conductivity type opposite to said first conductivity type into said semiconductor region through said new aperture to form a gate of said transistor having second conductivity type and a high impurity concentration, and controlling the diffusion in this step so that said gate has a depth less than that of said diffused region, said new aperture being formed during said step (c) having a dimension such that said gate surrounds a predetermined region, which is a current channel of said transistor, of said first semiconductor layer at a predetermined portion of said gate, and that a portion of the gate exclusive of said predetermined portion thereof overlaps a portion of said diffused region; and (e) forming, at one end of said current channel, a drain for said transistor having said first conductivity type.

2. The process according to claim 1 wherein said step (e) comprises the steps of: after said step (d), unmasking said one end portion of said current channel to be exposed, and thereafter diffusing an impurity element of said first conductivity type into said unmasked one end portion to form a diffused region to serve as said drain.

3. The process according to claim 1 wherein said impurity element employed in said step (b) has said first conductivity type, and the diffusion in said step (b) is controlled so that said diffused region has a high impurity concentration.

4. A process for manufacturing an integrated semiconductor device including a bipolar transistor and a field effect transistor formed in a single common semiconductor wafer comprising a semiconductor region having a first conductivity type and a low impurity concentration, which process comprises the steps of:

(a) forming, on one surface of said semiconductor region, a double-mask layer made from a first film and a second film superposed on said first film and having apertures formed through said double-mask layer;

(b) diffusing an impurity element of a predetermined first conductivity type into said semiconductor region through said apertures to form diffused regions have said first conductivity type and a predetermined impurity concentration;

(c) selectively etching said first film through said apertures and widening at least partially said apertures on said first film, thereby obtaining new apertures on said first film;

(d) diffusing an impurity element of a second conductivity type opposite to said first conducivity type into said semiconductor region through said new apertures to form an emitter of said bipolar transistor, a collector of said bipolar transistor, and a gate of said field effect transistor merged into said collector, and controlling the diffusion in this step so that said gate, emitter and collector have a depth less than that of said diffused regions, said new apertures being formed in said step (c) so as having dimensions such that said gate surrounds a predetermined region, which is defined as a current channel of said field effect transistor, of said semiconductor region at a predetermined portion of said gate, with a portion of the gate excluding said predetermined portion thereof overlapping a portion of at least one of said diffused regions, and that another predetermined region, which is defined as a base of said bipolar transistor, of said semiconductor region is sandwiched between a predetermined portion of said emitter and a predetermined portion of said collector, with other portions of said emitter and collector than said predetermined portions thereof overlapping portions of said diffused regions; and (e) forming, at one end of said current channel, a drain for said field effect transistor having said first conductivity type.

5. The process according to claim 4 wherein said step (e) comprises the steps of unmasking said one end portion of said current channel to be exposed, and thereafter diffusing an impurity element of said first conductivity type into said unmasked one end portion to form another diffused portion serving as said drain.

6. The process according to claim 4 wherein the impurity element used in said step (b) has said second conductivity type, and the diffusion in said step (b) is controlled so that said diffused region has a low impurity concentration.

7. The process according to claim 4 wherein the impurity element used in said step (b) has said first conductivity type, and the diffusion in said step (b) is controlled so that said diffused regions have a high impurity concentration.

8. A process for manufacturing a semiconductor device having at least three self-aligning semiconductor regions, said process comprising the steps of:

(a) forming on a surface of a semiconductor body a double-masking member comprising a lower mask and an upper mask having different constituents from each other;

(b) selectively removing portions of said double-masking member to form apertures therethrough and forming first semiconductor regions having a first impurity in said semiconductor body through said apertures;

(c) selectively removing portions of said lower mask and then removing said upper mask at the portions where the lower mask has been removed, thereby enlarging said apertures;

(d) doping a second impurity through said enlarged apertures;

(e) selectively removing portions of said double-masking member to leave at least a portion thereof;

(f) forming second semiconductor regions to be shallower than said first semiconductor regions so that each of said second semiconductor regions at least partially overlaps the corresponding member of said first semiconductor regions and forming a masking layer which is thicker than but integral with said lower mask of said remaining double-masking member;

(g) removing said remaining double-masking member and reducing the thickness of said masking layer to expose the semiconductor body at the portion of said remaining double-masking member; and (h) forming at least one third semiconductor region of a third impurity at said exposed semiconductor body.

9. The process according to claim 8 wherein said first impurity has a conductivity type opposite to that of said second impurity and said third impurity and said semiconductor body have the same conductivity type as that of said first impurity, and said first, second and third regions have a low resistivity.

10. The process according to claim 8 wherein said lower mask is made of $SiO_2$, and forming said second semiconductor regions to be shallower in step (f) by driving-in said second impurity while heating said semiconductor body in an oxidizing atmosphere, and the forming of the masking layer is carried out by forming an $SiO_2$ layer throughout the exposed surface produced after the double-masking member has been selectively removed and at the same time after the second impurity is driven-in due to said heating.

11. The process according to claim 8, 9 or 10 further comprising, between step (e) and step (f), the additional step of selectively removing said a portion left by the step (e).

* * * * *